(12) United States Patent
Andrews

(10) Patent No.: US 6,253,070 B1
(45) Date of Patent: Jun. 26, 2001

(54) DIODE AMPLIFIER BYPASS CIRCUIT

(75) Inventor: Joseph Andrews, San Marcos, CA (US)

(73) Assignee: Denso Corporation, Aichi-ken (JP)

( * ) Notice: Subject to any disclaimer, the term of this patent is extended or adjusted under 35 U.S.C. 154(b) by 0 days.

(21) Appl. No.: 09/121,202

(22) Filed: Jul. 22, 1998

(51) Int. Cl.$^7$ .................................................. H04B 1/18

(52) U.S. Cl. .................. 455/287; 455/254; 455/248.1; 455/283; 455/289; 330/51; 330/151

(58) Field of Search .............................. 455/232.1, 234.1, 455/234.2, 248.1, 250.1, 254, 296, 311, 217, 280, 283, 284, 285, 286, 287, 288, 289, 341; 330/151, 51

(56) References Cited

U.S. PATENT DOCUMENTS

| | | | | |
|---|---|---|---|---|
| 5,230,096 | * | 7/1993 | Davies et al. | 455/217 |
| 5,574,405 | * | 11/1996 | Razavi | 331/2 |
| 5,589,797 | * | 12/1996 | Gans et al. | 330/149 |
| 5,898,911 | * | 4/1999 | White | 455/232.1 |
| 5,914,634 | * | 6/1999 | Oberhammer | 327/560 |
| 5,995,814 | * | 11/1999 | Yeh | 455/180.1 |

* cited by examiner

Primary Examiner—Nay Maung
Assistant Examiner—Temica M. Davis
(74) Attorney, Agent, or Firm—Fish & Richardson P.C.

(57) ABSTRACT

RF circuit includes an amplifier and a shunt. The shunt is controlled to provide a path around the amplifier for avoiding intermodulation distortion caused by overdriving the amplifier. The shunt is formed by a diode with capacitors that match to the RF characteristics.

8 Claims, 1 Drawing Sheet

DIODE AMPLIFIER BYPASS CIRCUIT

BACKGROUND OF THE INVENTION

The present invention relates to an improvement in a code division multiple access ("CDMA") system.

The CDMA system includes a number of spaced transmitters. Each transmitter transmits to each of a plurality of handsets. The handsets can either be close to the base station or distant from the base station. The base station needs to transmit enough power so that all the handsets can receive the signal.

Sometimes, however, when the handset is too close to the transmitter, too much power may be received by the handset. The desired spectrum may be lower in amplitude than the undesired spectrum. Moreover, the desired and undesired spectra may be close enough in frequency such that the undesired spectra might not be removable by filtering. Problems occur from overdriving the input to the LNA, forming undesirable signal distortion and intermodulation products.

SUMMARY

According to the present disclosure, a single diode is used as a shunt RF bypass across an low noise amplifier ("LNA"). The diode turns on to bypass the transistor that forms the amplifier. The transmitter may be turned-off when the diode is turned-on in order to conserve bias current and prevent the transistor from generating spurious signals. Hence, amplification can be terminated when the incoming signal is sufficiently strong. This can avoid intermodulation distortion that could otherwise occur from overamplification.

An important feature of the present system is that the bias circuitry for the diode is included as part of the RF matching networks of the amplifier. This minimizes the number of components which are needed.

DESCRIPTION OF THE PREFERRED EMBODIMENTS

Figure 1:
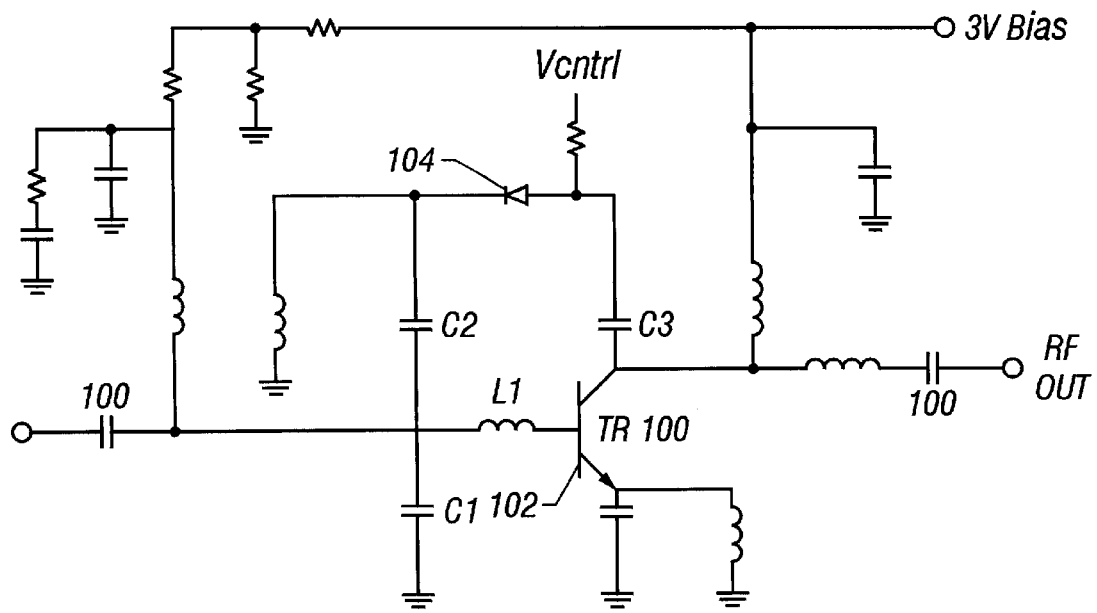

An embodiment of the system is shown in FIG. 1. The basic components of the system include the transistor 100 which functions as a low noise amplifier to amplify the signal that is coupled to its base 102. The signal is coupled to base 102 through coil L1. A bypass diode 104 is coupled between the base and collector of the transistor. When this diode turns on, it forms an RF shunt through the diode, hence allowing the RF to pass through the path defined by capacitor C2, diode 104, and capacitor C3 to the RF output.

The two capacitors C2 and C3 preferably have values of approximately 100 pF, which at 800 MHz becomes a DC short.

VCNTRL is used to control the bypass operation. When VCNTRL is 3 volts, the bypass diode is forward biased and hence turned on. The diode when forward biased provides an impedance of about 5 ohms at 800 MHz. The DC bias voltage is blocked by the capacitors C2–C3. The 3-volt bias to the transistor can also be turned off at this time in order to conserve current, since the transistor is not operating.

Conversely, when VCNTRL is zero volts, the bypass diode is turned off. The 3-volt transistor bias is turned on.

Figure 2:
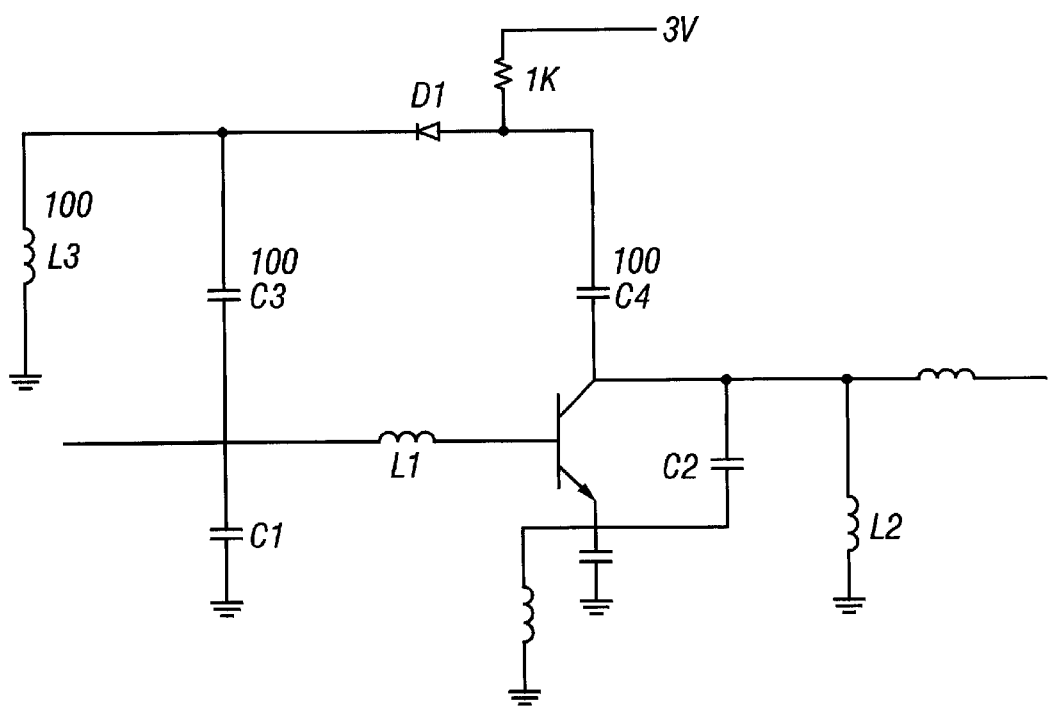

A specific implementation is shown in FIG. 2 showing how the elements and parasitics which are part of the diode circuit can be incorporated into the matching circuitry of the LNA. On the input side, L1 and C1 are part of the matching circuitry and L3, C3 and D1 are part of the diode circuitry. The diode circuitry is equivalent to a shunt capacitance which can be readily compensated by adjusting C1. Similarly on the output, C4 and D1 are equivalent to a shunt capacitance which can be compensated by adjusting the value of C2 which is already part of the output match. Thus, on both the input and the output the diode circuitry is incorporated as part of the input and output match of the LNA when the diode is in the off-state.

Although only a few embodiments have been described in detail above, other embodiments are contemplated by the inventor and are intended to be encompassed within the following claims. In addition, other modifications are contemplated and are also intended to be covered.

What is claimed is:

1. An RF receiver, comprising:
    a low noise amplifier having an input and an output, said low noise amplifier having a characteristic to amplify an incoming signal at said input, and having a characteristic whereby a specified signal level input to the low noise amplifier will cause an undesired output at said output;
    a shunt associated circuitry;
    a controllable shunt between said input and said output of the low noise amplifier, said controllable shunt using only a single diode to shunt RF, said controllable shunt being controlled between a first state where the low noise amplifier is bypassed, and a second state where the low noise amplifier is not bypassed, said controllable shunt interfacing with said shunt associated circuitry for allowing operation of the single diode, such that said shunt associated circuitry incorporates the single diode into an RF matching networks of the low noise amplifier to minimize the need for additional components.

2. A receiver as in claim 1, wherein said associated circuitry is used for RF matching at 800 MHZ.

3. A receiver as in claim 1, wherein said associated circuitry includes at least one capacitor.

4. A receiver as in claim 1, wherein said single diode is forward biased to bypass said amplifier, and is not forward biased to allow said amplifier to operate.

5. An RF receiver, comprising:
    a low noise amplifier having an input and an output, said low noise amplifier having a characteristic to amplify an incoming signal at said input, and having a characteristic whereby a specified signal level input to the low noise amplifier will cause an undesired output at said output,
    the low noise amplifier device may be toggled on or off depending on the state of a shunt diode;
    a first circuitry;
    a controllable diode shunt having only a single diode, said controllable diode shunt disposed between said input and said output of the low noise amplifier, selectively controlled between a first state where the low noise amplifier is bypassed, and a second state where the low noise amplifier is not bypassed,
    said first circuitry operating to interface with the controllable diode shunt, said first circuitry being incorporated as part of the input and output match of the low noise amplifier when the diode is in the off-state, such that the first circuitry incorporates the single diode into an RF matching networks of the low noise amplifier to minimize the need for additional components.

6. An RF receiver as in claim 5, wherein said associated circuitry includes capacitors for blocking a DC bias voltage to the diode shunt.

7. An RF receiver as in claim 6, wherein said circuitry includes capacitors on both the input and the output, which perform a matching operation.

8. An RF receiver as in claim 6, wherein said circuitry includes components necessary for toggling the transistor bias on and off.

\* \* \* \* \*